(12) United States Patent
Diop et al.

(10) Patent No.: US 8,554,501 B2
(45) Date of Patent: Oct. 8, 2013

(54) METHOD AND DEVICE FOR THE NON-INTRUSIVE DETERMINATION OF THE ELECTRICAL POWER CONSUMED BY AN INSTALLATION, BY ANALYSING LOAD TRANSIENTS

(75) Inventors: Alioune Diop, Asnières (FR); Thierry Jouannet, Montluçon (FR); Khalil El Khamlichi Drissi, Cournon d'Auvergne (FR); Hala Najmeddine, Beaumont (FR)

(73) Assignees: Electricite de France, Paris (FR); Universite Blaise Pascal Clermont II, Clermont Ferrand (FR); Landis + Gyr, Montlucon (FR); Centre National de la Recherche Scientifique—CNRS, Paris (FR)

( * ) Notice: Subject to any disclaimer, the term of this patent is extended or adjusted under 35 U.S.C. 154(b) by 248 days.

(21) Appl. No.: 13/122,535

(22) PCT Filed: Oct. 2, 2009

(86) PCT No.: PCT/FR2009/051886
§ 371 (c)(1),
(2), (4) Date: Apr. 4, 2011

(87) PCT Pub. No.: WO2010/037988
PCT Pub. Date: Apr. 8, 2010

(65) Prior Publication Data
US 2011/0191041 A1    Aug. 4, 2011

(30) Foreign Application Priority Data
Oct. 3, 2008   (FR) ...................................... 08 56717

(51) Int. Cl.
*G01R 21/00*   (2006.01)
*G01R 21/06*   (2006.01)

(52) U.S. Cl.
USPC .............................................. 702/61; 702/60

(58) Field of Classification Search
USPC ................. 702/57, 60, 61, 64, 189; 700/291, 700/293, 294
See application file for complete search history.

(56) References Cited

U.S. PATENT DOCUMENTS 5,483,153 A    1/1996   Leeb et al.
6,816,078 B2   11/2004  Onoda et al.

(Continued)

FOREIGN PATENT DOCUMENTS

WO    WO 97/25625 A1    7/1997

OTHER PUBLICATIONS

Cole et al., "Data Extraction for Effective Non-Intrusive Identification of Residential Power Loads," Instrumentation and Measurement Technology Conference, 1998, IMTC/98, St. Paul, MN, USA, May 18-21, 1998, Conference Proceedings, IEEE, New York, NY, USA, vol. 2, pp. 812-815 (May 18, 1998).

(Continued)

*Primary Examiner* — Marc Armand
*Assistant Examiner* — Ricky Ngon
(74) *Attorney, Agent, or Firm* — Drinker Biddle & Reath LLP

(57) ABSTRACT

A method and device for the non-intrusive determination of the electrical power consumed by a subscriber installation. From the sampled values of the supply current and supply voltage that are delivered to the installation, constituting a consumption signal, the sampled values are grouped in successive observation time windows; the poles and residues of the consumption signal are discriminated in each current window using the pencil method, the set of poles and residues associated with at least one singular value representing a combination of signatures of separate electrical loads; at least the active power consumed by a subset of electrical loads in operation is calculated, over at least the duration of the current observation window, the sum of the active powers consumed by each electrical load satisfying a consumed power function linking these poles and residues.

14 Claims, 10 Drawing Sheets

(56) References Cited

U.S. PATENT DOCUMENTS 7,987,059 B2 * 7/2011 Gong et al. .................. 702/66
8,000,914 B2 * 8/2011 Venkatasubramanian
 et al. ............................. 702/60

OTHER PUBLICATIONS

Hua et al., "Generalized Pencil-of-Function Method for Extracting Poles of an EN System from Its Transient Response," IEEE Transactions on Antennas and Propagation, vol. 37 (2), pp. 229-234 (Feb. 1989).

Roos, "Non-intrusive load monitoring of electrical appliances," Elektron, Elektron Verlag, AT, vol. 11 (4), pp. 27-30 (Apr. 1, 1994).

Zhu et al., "Spectral Estimation of Two-Dimensional NMR Signals by Matrix Pencil Method," Proceedings of the Region Ten Conference (Tencon), Beijing, IAP, CN, Oct. 19-21, 1993, pp. 546-549 (Oct. 19, 1993).

* cited by examiner

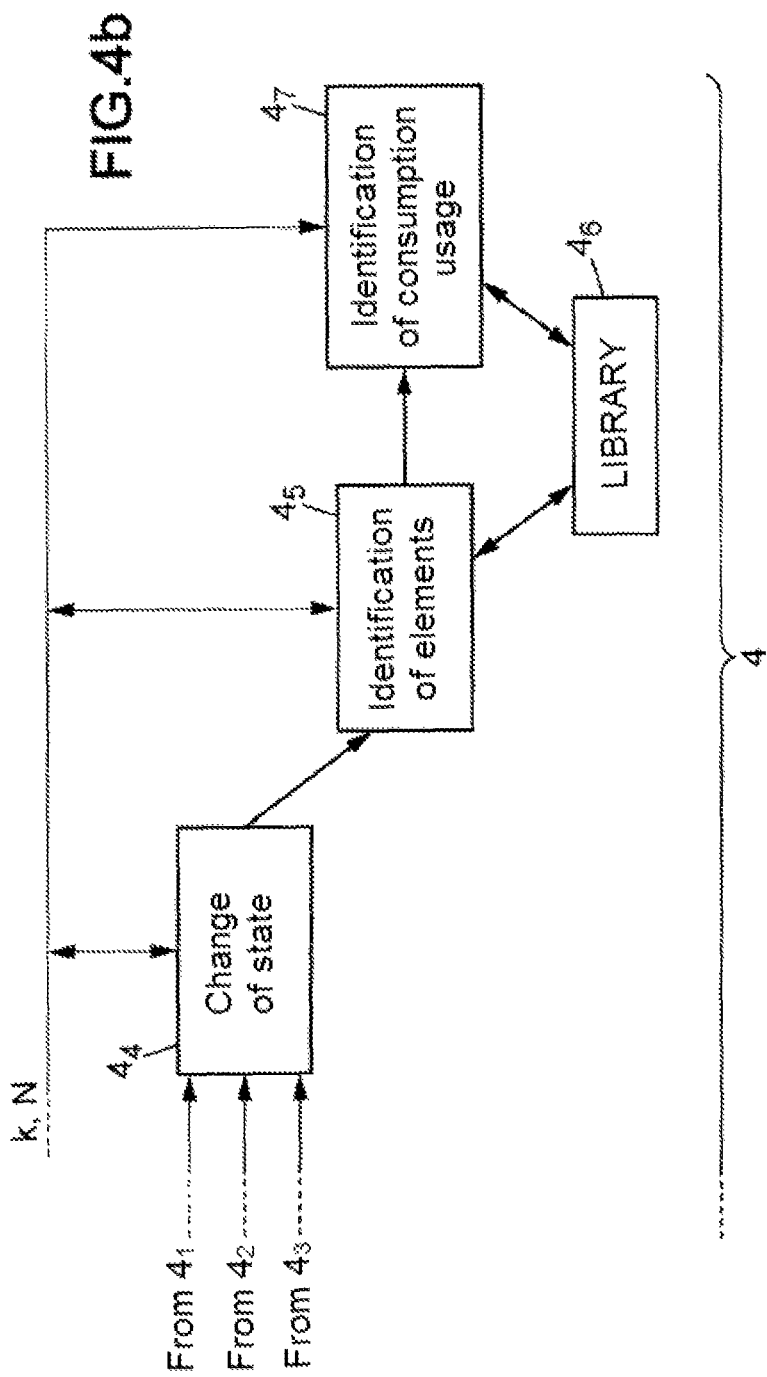

METHOD AND DEVICE FOR THE NON-INTRUSIVE DETERMINATION OF THE ELECTRICAL POWER CONSUMED BY AN INSTALLATION, BY ANALYSING LOAD TRANSIENTS

CROSS-REFERENCE TO RELATED APPLICATIONS

This application is the U.S. national phase of the International Patent Application No. PCT/FR2009/051886 filed Oct. 2, 2009, which claims the benefit of French Application No. 08 56717 filed Oct. 3, 2008, the entire content of which is incorporated herein by reference.

FIELD OF THE INVENTION

The invention relates to a method and a device for the non-intrusive determination of the electrical power consumed by an installation, by analysing load transients.

BACKGROUND

At present the electrical power consumed by a client subscriber installation, supplied by the alternating-voltage grid, and the corresponding electrical power consumption, are determined from direct measurements of the physical parameters of the installation, such as the supply voltage, the intensity of the electric current delivered, the phase displacement between the electric current delivered and the supply voltage.

Usually electronic modules make it possible, on the basis of the aforementioned values of voltage, current and phase displacement, to calculate the active or reactive electrical power consumed, and, by integrating successive power values over a given time range, the electrical energy consumed.

The aforementioned electronic modules are most often installed in a meter, such as an electronic meter and can in certain cases proceed to transmission of the aforementioned measured values and/or of the values of power or of energy finally consumed.

The aforementioned meters are satisfactory.

However, they have the drawback that they require the aforementioned electronic modules to be installed in the meter itself, and therefore within the subscriber's private premises, i.e., most often, the subscriber's dwelling.

Various developments have been proposed for moving the measurement and metering of power or of energy away from the subscriber's private premises.

One such approach consists of carrying out measurement of supply voltage and of current delivered outside of the subscriber's private premises, by analysing the overall load curve of the installation either at the meter, or upstream of the latter, on the branching of the subscriber installation, with a view to employing non-intrusive processes, known as NIALM, for Non-Intrusive Appliance Load Monitoring.

The aforementioned non-intrusive processes are clearly of benefit for suppliers, distributors and consumers of electrical energy faced with the challenge of forecasting the costs of energy, of developments of networks and of reduction of consumptions.

The NIALM processes reveal several degrees of non-intrusion, those comprising a stage of automated training of the appliances, described in U.S. Pat. No. 4,858,141, and those comprising a stage of manual training of the appliances, described for example in U.S. Pat. No. 5,483,153. The manual NIALM processes prove to be more accurate than the automatic NIALM processes, as the consumption signatures of the appliances are collected at different states of consumption.

However, this semi-intrusion is annoying for the subscriber and unattractive for the distributor or supplier of electrical energy.

In the case of manual NIALM processes, a library of electrical receiving appliances is constructed, from an electric current sensor on each appliance.

In the case of automatic NIALM processes, a library of electrical receiving appliances, improving over time, is constructed based on the powers measured at the meter.

The aforementioned libraries actually make it possible to identify each electrical appliance and its consumption, and have promoted development towards identification of the usages of these appliances, or even of the habits, of usage or of consumption of the latter by subscribers provided with them.

Thus, various procedures have been proposed for identification of usages:

based on recognition of the variation in current intensity, as described in patent application FR 2 645 968. This variation is compared with a threshold representative of an event, connection or disconnection of a domestic load. The threshold values are listed in a library;

from measurement of the variations of active and reactive power and/or of admittance of the installation in the steady state, as described in U.S. Pat. No. 4,858,141. Comparison with a reference table of various appliances available on the market, stored in a library, is carried out;

from measurement of the current at the fundamental frequency and of its harmonics, as described in U.S. Pat. No. 6,816,078. Each appliance is identified by the harmonics (by frequency transform FFT) that it generates, and is classified in a library. The operation of the electrical appliances is evaluated at the true value by verification of the existence of the highest harmonic frequencies making up the total electric current;

from measurement of the active and reactive powers of the installation in transient conditions, as described in U.S. Pat. No. 5,483,153. The shapes of the transients are compared against a database for recognition of the loads;

based on exploitation of the start-up HF pulse emitted by electrical appliances connected to the electricity grid as described in patents EP 1 136 829 and U.S. Pat. No. 7,078,982 B2. This procedure requires, if necessary, on each appliance to be detected, fitting a device for emitting HF signals on the public network, receivers or repeaters for amplifying the HF signals. Although described as non-intrusive, this procedure requires several series of switching the electrical appliances on and off one after another, when the identification device is first installed;

based on measurements carried out on the current and voltage for determining the variation of the impedance of the loads of the installation over time, as described in patent application WO 93/04377. However, such a process is still intrusive. A bulk storage component in the meter must be replaced periodically by an employee.

All of the aforementioned processes involve a level of intrusion that is incompatible with the mass diffusion represented by the vast numbers of domestic appliances.

The aforementioned processes make use of parameters and quantities that are more in keeping with grids supplying purely sinusoidal voltage, such as apparent, reactive, and active powers, effective values of current and of voltage, and are thus harmed, as they are poorly suited, to the wide use, on subscriber installations, of more and more numerous electronic appliances generating electrical perturbations and noise, which are superposed on the fundamental component.

The aforementioned processes that are best known by a person skilled in the art employ, for analysing the signals, frequency processing of the fast Fourier transform (FFT) type.

This type of processing requires a relatively large observation window of the signal being processed, in order to provide effective discrimination of the various components of the signal being processed, fundamental frequency, at 50 Hz or 60 Hz, and harmonic frequencies, for satisfactory processing of the aforementioned noise components superposed on the fundamental component.

In parallel with the aforementioned methods of purely frequency analysis, by frequency transform, of the Fourier transform type, other theoretical methods of analysis of the response, transmitted in real time, of systems submitted to a variable electromagnetic field have been proposed.

Developed essentially for studying the response of reflectors or of antennas excited by an electromagnetic wave that is assumed to propagate by plane waves, a special method, called the Pencil Method, was proposed, which makes it possible, from the transient and permanent response of a target to radiated electromagnetic excitation, to determine the poles and residues of the aforementioned response by resolving a generalized eigenvalue problem.

For a description of a theoretical approach of the aforementioned Pencil method, applied to a target formed by an electrically conducting wire, we may usefully refer to the article with the title "Generalized Pencil-of-Function Method for Extracting Poles of an EM System from its Transient Response" published by Yingbo Hua and Tapan K. Sarkar, members of the Department of Electrical and Computer Engineering, Syracuse University, Syracuse, N.Y. 13344-1240, IEEE TRANSACTIONS ON ANTENNAS AND PROPAGATION, Vol. 37, No. 3, February 1989, p 229-234.

More recently, a comparative study between the comparative performance in spectral resolution between the frequency processing techniques, such as the Fourier transform, and the Pencil method, with the title "Comparison between the Matrix Pencil Method and the Fourier Transform Technique for High Resolution Spectral Estimation" published by Jose Enrique Fernandez del Rio and Tapan K. Sarkar, Department of Electrical and Computer Engineering, 121 Link Hall, Syracuse University, N.Y. 13244-1240, Digital Signal Processing 6, 108-125 (1996) Article No. 0011, showed that the Pencil method is superior to the frequency processing methods by Fourier transform, with respect to dispersion of estimation and root-mean-square error, for a signal-to-noise ratio above a certain threshold value.

SUMMARY

The present invention relates to the implementation of a method and a device for non-intrusive determination of the electrical power consumed by an installation, by analysing load transients by the Pencil method, the installation being likened to one or more loads, which can have response characteristics that are variable over time, partially and/or completely absorbing the electrical energy delivered in the form of a signal of electromagnetic excitation by the distribution grid.

The method for non-intrusive determination of the electrical power consumed by a subscriber installation, according to the present invention, is executed on the basis of periodic sampling of the values of supply voltage and of electric current intensity delivered to said installation in order to obtain a consumption signal.

It is notable in that, based on the sampled values of the consumption signal, it consists at least of grouping these sampled values in successive observation time windows, discriminating, in each successive current observation time window, the set of poles and residues of the consumption signal by the Pencil method. This set of poles and residues is representative, on the current observation window, of a combination of signatures of separate electrical loads including at least defined poles and residues associated with at least one singular value obtained by the Pencil method in operation in this installation, calculating for at least the duration of the current observation window, at least the active power consumed by at least one subset of the electrical loads in operation in the installation, expressed as the sum of the active powers consumed by each separate electrical load of this subset verifying a function of consumed power linking these poles and residues.

The method according to the invention is also notable in that for the active power, the power function complies with the relation:

$$P = \sum_{i=1}^{M} \sum_{i'=1}^{M'} R_{ci} \cdot R_{vi'} \cdot e^{(S_{ci}+S_{vi'})(t_{kd}+\frac{\Delta t}{2})} \cdot \sinh c\left((S_{ci}+S_{vi'})\frac{\Delta t}{2}\right)$$

where P denotes the active power consumed by the set of separate electrical loads $C_i$ of signature $(S_i, R_i, SG_i)$;

$S_{ci}$ and $R_{ci}$: denote the poles and residues respectively of the sampled current delivered to the installation;

$S_{vi'}$ and $R_{vi'}$: denote the poles and the residues respectively of the sampled voltage delivered to the installation $SG_i$ denoting the singular values;

$t_{kd}$: denotes the start time of the observation window of rank k;

$\Delta t$: denotes the duration of the observation window;

sinh c(X): denotes the hyperbolic sine function of the cardinal of value X, i.e.

$$\sinh c\left((S_{ci}+S_{vi'})\frac{\Delta t}{2}\right) = \sinh\left((S_{ci}+S_{vi'})\frac{\Delta t}{2}\right) / \left((S_{ci}+S_{vi'})\frac{\Delta t}{2}\right)$$

M: denotes the number of observed poles and residues of the sampled current delivered to the installation;

M': denotes the number of observed poles and residues of the sampled voltage delivered to the installation.

The method according to the invention is also notable in that the sampling frequency, for obtaining the consumption signal, and the duration $\Delta t$ of each observation window are linked by the relation:

$$\Delta t \cdot fe = Nem \geq 2 \cdot \left[\sum_{i=1}^{Nc} nci + 2(1+H)\right]$$

in which

Nem: denotes the minimum number of samples from the duration of each observation window, Nc denotes the observed number of separate electrical loads of the subscriber installation, nci denotes the number of poles of the electrical load considered, H denotes the number of harmonic components of the fundamental frequency of the supply voltage.

The method according to the invention is moreover notable in that, for an observation window of the consumption signal including the free regime and the beginning of the forced regime of connection/disconnection of a load, the connection/disconnection of a purely resistive load is signified by a unique forced regime, by the existence, for the observation window, of two conjugated complex poles with a zero real part and of two conjugated complex residues in the forced regime, and by the zero phase of the residues in the forced regime, the connection/disconnection of a resistive and capacitive load is signified by a separate free regime and a separate forced regime, by the existence, for the observation window, of two conjugated complex poles with a zero real part and of two conjugated complex residues with a zero real part in the forced regime and by a real pole and a residue in the free regime, the negative phase of the residue in the forced regime characterizing the overall capacitive nature of the load, the connection/disconnection of a resistive and inductive load is signified by a separate free regime and a separate forced regime, by the existence, for the observation window, of two conjugated complex poles with a zero real part and of two conjugated complex residues in the forced regime and by a real pole and a complex residue in the free regime, the positive phase of the residue characterizing the overall inductive nature of the load.

The method according to the invention is finally notable in that, for an observation window of the consumption signal including the free regime and the start of the forced regime of connection/disconnection of a load, the connection/disconnection of a resistive, inductive and capacitive load is signified by a separate forced regime and a separate free regime, by the existence, in the forced regime, of two conjugated complex poles with a zero real part and of two conjugated complex residues, and, in the free regime, of two conjugated complex poles and two conjugated complex residues, the negative phase of the residue in the forced regime characterizing the overall capacitive nature of the load and the positive phase of the residue in the forced regime characterizing the overall inductive nature of the load.

The device for non-intrusive determination of the electrical power consumed by a subscriber installation, according to the invention, comprises at least means for periodic sampling of the values of supply voltage and of electric current intensity delivered to said installation in order to obtain a consumption signal.

It is notable in that it moreover comprises at least one module for calculation of the instantaneous power delivered, the product of the sampled values of the values of delivered supply voltage and delivered electric current intensity, the consumption signal having at least one of the sampled values of the delivered supply voltage, the delivered electric current intensity or the delivered instantaneous power, means for storing and reading the successive values of the consumption signal in at least one observation window, means for application, on the consumption signal, in at least one current observation window, of processing by filtering by the Pencil method, for discriminating, in this window, the set of poles and residues representative of a combination of signatures of separate electrical loads including at least the poles and residues associated with at least one singular value obtained by the Pencil method in operation in the installation, a module for temporal tracking of the combination of signatures and for calculation, for at least the duration of the current observation window, of at least the active power consumed by at least one subset of the electrical loads in operation in the installation, expressed as the sum of the active powers consumed by each separate electrical load of this subset verifying a consumed power function linking these poles and residues.

The device according to the invention is moreover notable in that the module for temporal tracking of the combination of signatures and for calculation of at least the active power consumed by at least one subset of the electrical loads comprises, at least, a module for detecting change of state of connection/disconnection of the electrical load, a module for identifying the connected and/or disconnected electrical loads from the signatures of the electrical load, a library module of electrical loads identified in relation to their signature, a module for identifying the consumption usages of the subscriber use and for calculating the consumption, at least in active power.

The method and the device according to the invention find application for the non-intrusive management of domestic or industrial installations of electrical appliances, for the construction of meters of electrical energy consumed, and, more generally, for the supervision and monitoring of users' electrical installations.

BRIEF DESCRIPTION OF THE DRAWINGS

They will be better understood on reading the following description and on examining the drawings, in which:

FIGS. 4a and 4b show, by way of illustration, a functional diagram, in the form of a block diagram, of a device for non-intrusive determination of the electrical power consumed on an installation, according to the present invention.

DETAILED DESCRIPTION

A detailed description of the stages of implementation of the method for non-intrusive determination of the electrical power consumed by an installation, by analysing load transients, in accordance with the invention, will now be given in connection with FIG. 1a and the subsequent figures.

The non-intrusive implementation of the method and of the device according to the invention is understood as execution of implementation in total transparency of operation with respect to any subscriber's installation, either downstream of and/or in any meter of said subscriber, or upstream of the latter.

Figure 1A:
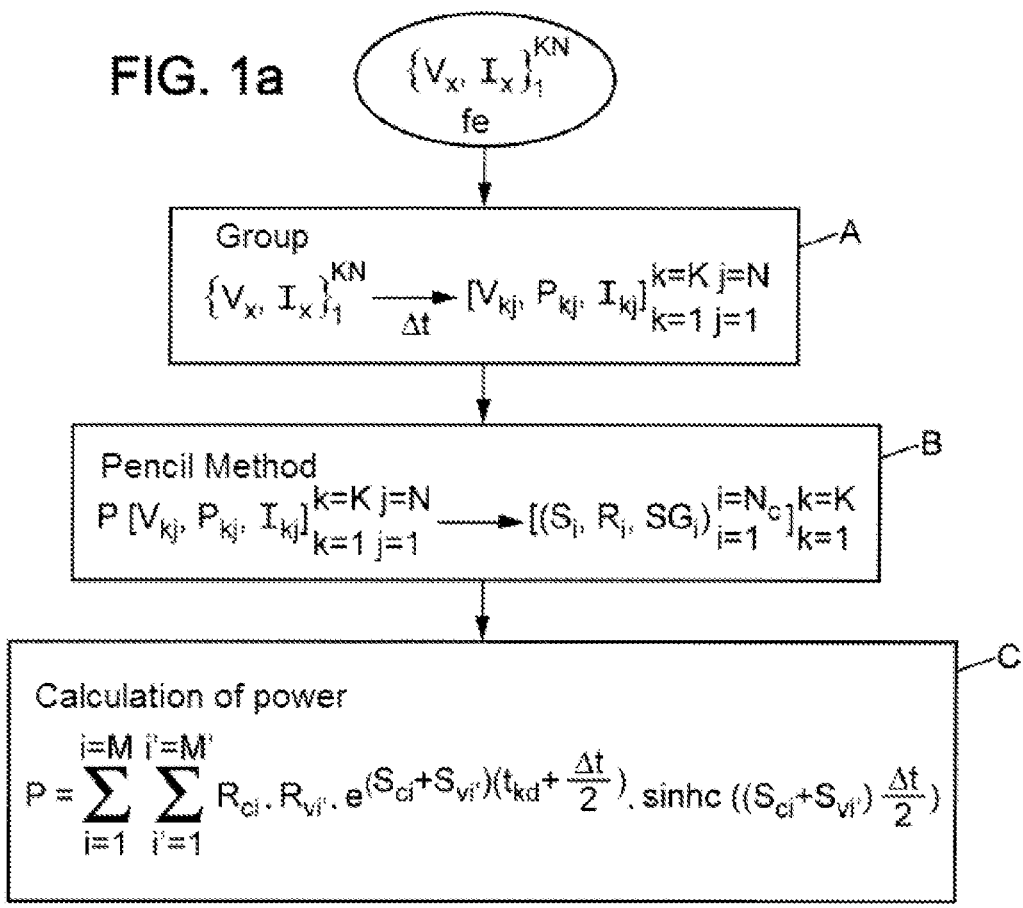
FIG. 1a shows, purely by way of illustration, a flowchart of the essential stages for implementation of the method according to the invention.

Referring to the aforementioned FIG. 1a, consider a subscriber installation, a domestic or industrial installation, for which one has values of supply voltage and of electric current intensity delivered to said installation, obtained by periodic sampling, for obtaining a consumption signal.

In FIG. 1a, the sampled values of voltage $V_x$ and of intensity $I_x$ of the current delivered are designated according to relation (1):

$$\{V_x, I_x\}_1^{KN}$$
$$fe$$

In this relation, x denotes the successive sampling rank of the aforementioned values, KN denotes any final value of the sampling rank in K successive sampling windows each having N samples, fe denotes the sampling frequency of the aforementioned values.

According to a notable aspect of the method according to the invention, it consists, starting from the sampled values of the consumption signal, in a stage A, of grouping the aforementioned sampled values in successive observation time windows.

At stage A in FIG. 1a, the corresponding operation is designated according to relation (2):

$$\{V_x, I_x\}_1^{KN} \rightarrow [V_{kj}, P_{kj}, I_{kj}]_{k=1,j=1}^{k=K,j=N}$$

By "corresponding operation" is meant that any set of sampled values is in fact subdivided into a plurality of subsets of sampled values, each constituting an observation window of these sampled values, in which k denotes the rank of the observation window and j denotes the rank of the sampled value of voltage delivered and respectively of current delivered in the observation window of rank k under consideration. Moreover, K denotes the final value of the rank of the last observation window employed and N denotes the final value of the rank of the last sample of voltage and respectively of currents in each observation window of rank k under consideration.

In general, it is stated that grouping of the successive samples of value of voltage delivered and respectively of current delivered can be carried out by selective read-write addressing of values of voltage samples delivered and of current delivered in memory, in a conventional manner.

The successive observation windows thus obtained can advantageously form windows without covering, the application of weighting template and/or observation of the samples not being necessary.

Each observation window formed by a succession of N samples of value of voltage delivered and respectively of current delivered corresponds to a duration of observation $\Delta t$ proportional to the number N of samples. The aforementioned grouping stage A is then followed by a stage B consisting of discriminating, in each current observation time window, of successive rank k, at least the set of poles designated $S_i$ and of residues $R_i$ of the consumption signal by the Pencil method.

In stage B in FIG. 1a, the operation of discrimination of the poles and residues is designated by relation (3):

Pencil Method
$$\mathscr{P} \; [V_{kj}, P_{kj}, I_{kj}]_{k=1,j=1}^{k=K,j=N} \rightarrow [(S_i, R_i, SG_i)_{i=1}^{i=Nc}]_{k=1}^{k=K}$$

In the above relation (3), $\mathscr{P}$ denotes application of the Pencil method, by data processing applied to the samples;

$[V_{kj}, P_{kj}, I_{kj}]$ denotes each observation window of rank k of N samples;

$[(S_i, R_i, SG_i)_{i=1}^{i=Nc}]_{k=1}^{k=K}$ denotes the set of observed poles $S_i$, residues $R_i$ and singular values $SG_i$ found by the Pencil method in the observation window of rank k under consideration.

According to a notable aspect of the method according to the invention, the set of aforementioned poles, residues and singular values is representative, on the current observation window of rank k under consideration, of a combination of signatures $\mathscr{S}_1$ of separate electrical loads $C_i$.

It should be noted that according to a specific non-limitative aspect of the method according to the invention, the poles $S_i$, the residues $R_i$ and the singular values $SG_i$ of any electrical load $C_i$ are calculated on at least one of the components of current, of voltage or of instantaneous power forming a consumption signal, delivered to the installation, as will be explained later in the description.

Each signature $\mathscr{S}_1$ includes at least defined poles $S_i$ and residues $R_i$ associated with at least one singular value $SG_i$ representative of a load and of switching of the latter on or off in the installation.

Thus, each signature $\mathscr{S}_1$ is formed by a triplet of numerical values representative of poles, of residues and of a singular value, and represented by the notation $\mathscr{S}_1$ ($S_i, R_i, SG_i$).

Stage B is then followed by a stage C consisting of calculating the electrical power consumed for at least the duration of the aforementioned current observation window.

It is to be understood that, according to a non-limitative advantageous embodiment of the method according to the invention, the aforementioned power calculation can be carried out at least for the active power consumed by at least one subset of the electrical loads in operation in the installation, for the reactive power or finally for any type of electrical power consumed.

According to a notable aspect of the method according to the invention, calculation of the power consumed by at least one subset of the electrical loads is established as the sum of the powers consumed by each separate electrical load of this subset, verifying a consumed power function linking the aforesaid poles and residues. At stage C in FIG. 1a, and just as a non-limitative example for the active power consumed, the power function complies with relation (4):

$$P = \sum_{i=1}^{M} \sum_{i'=1}^{M'} R_{ci} \cdot R_{vi'} \cdot e^{(S_{ci}+S_{vi'})(t_{kd}+\frac{\Delta t}{2})} \cdot \sinhc\left((S_{ci}+S_{vi'})\frac{\Delta t}{2}\right)$$

where P: denotes the active power consumed by the set of separate electrical loads $C_i$ of signature $(S_i, R_i, SG_i)$;

$S_{ci}$ and $R_{ci}$: denote the poles and respectively the residues of the sampled current delivered to the installation;

$S_{vi'}$ and $R_{vi'}$: denote the poles and respectively the residues of the sampled voltage delivered to the installation;

$t_{kd}$: denotes the start time of the observation window of rank k;

$\Delta t$: denotes the duration of the observation window; sinh c(X): the hyperbolic sine function of the cardinal of the value X, i.e.

$$\mathrm{sinhc}\left((S_{ci}+S_{vi'})\frac{\Delta t}{2}\right) = \mathrm{sinh}\left((S_{ci}+S_{vi'})\frac{\Delta t}{2}\right) \bigg/ \left((S_{ci}+S_{vi'})\frac{\Delta t}{2}\right);$$

M: denotes the number of observed poles and residues of the sampled current delivered to the installation;

M': denotes the number of observed poles and residues of the sampled voltage delivered to the installation.

Relation (4) thus expresses the power function in the observation window.

Various theoretical qualitative process justifications permitting application of the method according to the invention will be given below.

In general, it should be noted that the consumption signal is formed by the set of sampled values of voltage and/or of current delivered to the installation, optionally supplemented with the value of instantaneous power roughly corresponding to the product of the sampled value of voltage and respectively of currents delivered to the installation, or to a combination of these values, as will be explained in more detail later in the description.

Implementation of the Pencil method, by data processing applied to the aforementioned values, performs the calculation of a Hankel matrix based on a transformation by the method designated SVD, for Single Value Decomposition.

The poles $S_i$ thus found represent the contribution to the response of the load in the temporal sense to the consumption signal.

The residues $R_i$ represent the contribution to the response of the load in the energy exchange or absorption sense to the consumption signal.

The singular values $SG_i$ represent the transition from a state of consumption to another owing to connection/disconnection, total or partial, of a load from the installation. The aforementioned singular values are directly linked to identification of the eigenvalues of the Hankel matrix, during application of the Pencil method.

For each observation window of the sampled values, or more generally of the consumption signal, there is a corresponding set of singular values.

The change of singular value represents the change or transition of the consumption signal, since the singular values have the same value in the stationary state, in the absence of total or partial load switching.

The bouncing of the singular values is linked to the value of the poles $S_i$.

The appearance of a singular value in the observation window or in a succession of observation windows is roughly synchronized with the change in regime of current intensity consumed by the installation on simultaneous or non-simultaneous switching of one or more loads of the installation.

Finally discrimination of the poles and of the residues makes it possible to discriminate the type of load in operation, resistive, capacitive or inductive load, as will be described in more detail later in the description.

More specifically, it can be said that, for implementation of the method according to the invention and for a roughly periodic supply voltage of frequency $\omega$ and of period T, the duration $\Delta t$ of each current observation window of rank k can be taken as equal to the period T.

Such a choice of the duration of the observation window is not indispensable. However, from a granular standpoint of the observation, the aforementioned choice permits, as it were, return of the grid or of the installation and of the load to the initial state.

More generally, the duration of each observation window can be selected taking into account the sampling frequency fe, according to relation (5):

$$\Delta t \cdot fe = Nem \geq 2 \cdot \left[ \sum_{i=1}^{N_c} nci + 2(1+H) \right]$$

In the above relation, fe denotes the sampling frequency;

Nem denotes the minimum number of samples for the duration of each observation window;

Nc denotes the observed number of separate electrical loads $C_i$ of the subscriber installation;

nci denotes the number of poles of the electrical load $C_i$ considered;

H denotes the number of harmonic components of the fundamental frequency of the supply voltage.

Figure 1B:
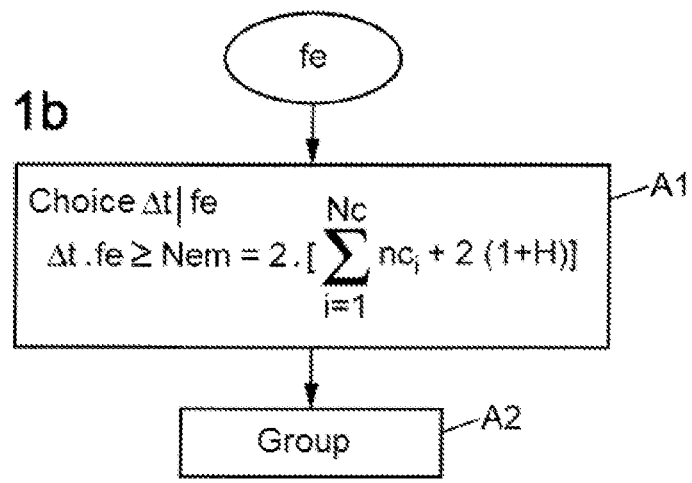
FIG. 1b shows, by way of illustration, a non-limitative preferred embodiment of the method according to the invention, in which a specific choice of the duration of the observation window can be made in relation to the frequency of sampling of the voltage and/or current signal.

Referring to FIG. 1b, it should be noted that the choice of the duration $\Delta t$ can be based for example on the aforementioned relation during a substage $A_1$ and then execution of the corresponding group in a subsequent, substage $A_2$. Stages B and C can then be carried out in succession.

A more detailed description of stages of discrimination and acquisition of the signatures, identification of the electrical loads constituting the subset of separate electrical loads and then monitoring of the switching on/off of each separate load, according to the method of the invention, will now be given with reference to FIGS. 2a, 2b and 2c respectively.

In general, it can be said that the aforementioned stages are executed on the numerical values representative of the residues, poles and singular values by programs for sorting these numerical values, the general flowcharts of which are shown purely by way of illustration in the aforementioned figures.

Figure 2A:
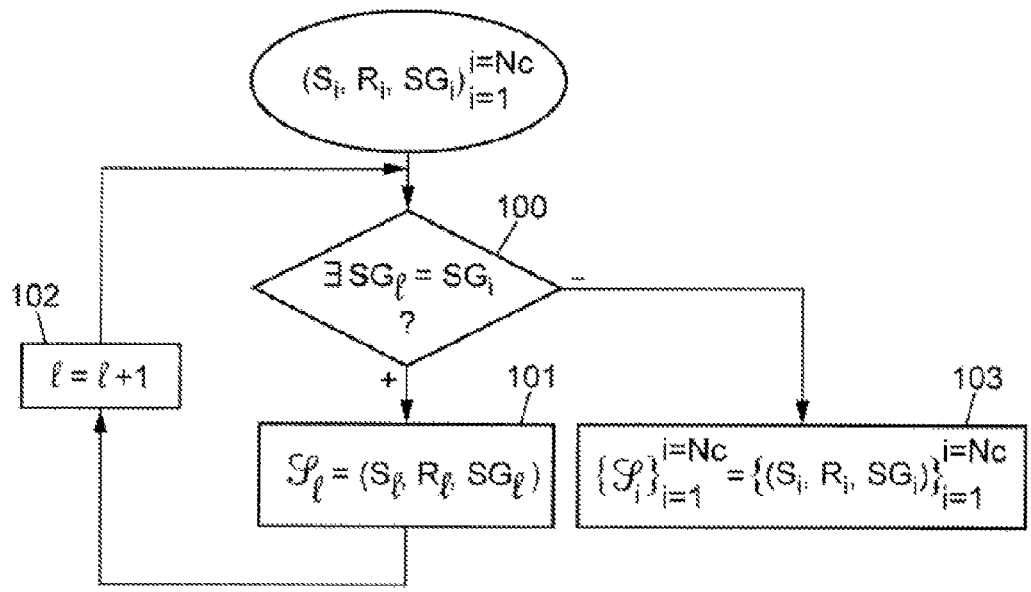
FIG. 2a shows, purely by way of illustration, a non-limitative example of application of a stage of acquisition of the signatures of observed loads in a subscriber's installation.

Referring to FIG. 2a, following the stage consisting of discriminating the set of poles and of residues of the consumption signal, the method according to the invention comprises a stage of discrimination and of acquisition of the signatures $\mathscr{S}_i$ $(S_i, R_i, SG_i)$ formed by a pair of poles $S_i$, residues $R_i$ with which a singular value $SG_i$ is associated.

A more detailed process description permitting application of a stage of discrimination and of acquisition of the signatures $\mathscr{S}_i$, for identifying the electrical loads $C_i$ in operation in an observation window, and respectively of monitoring of switching on/off of each separate load will now be given with reference to FIGS. 2a, 2b and 2c respectively.

Referring to FIG. 2a, following the stage consisting of discriminating the set of poles $S_i$ and of residues $R_i$ of the consumption signal, the stage of discrimination and acquisition of the signatures $\mathscr{S}_i$ can be illustrated according to the process shown in the aforementioned figure, based on the triplets $(S_i, R_i, SG_i)_{i=1}^{i=Nc}$.

The set of the aforementioned triplets being stored for example in the form of a list, in a stage 100 one proceeds to the reading of each singular value $SG_i$ at our disposal in the set of singular values $SG_i$ stored according to the symbolic relation (6):

$$\exists SG_i = SG_i?$$

With a positive response to test 100, i.e. for reading of the singular value $SG_i$ the triplets $(S_i, R_i, SG_i)$ are assigned a corresponding signature identifying code designated $\mathscr{S}_i$, in stage 101.

The process is continued for the next singular value of index l+1 by return via stage 102 to the aforementioned stage 100, for as long as there is an unread singular value $SG_i$.

Conversely, with a negative response to the reading test in stage 100, the process of reading the set of singular values is interrupted and one has, in stage 103, the set of signatures $\mathscr{S}_i$ of electrical loads $C_i$ that may appear by total or partial switching on/off in the installation considered.

The set of aforementioned signatures can then be stored in a storage memory or library of signatures, as will be described later in the description.

Figure 2B:
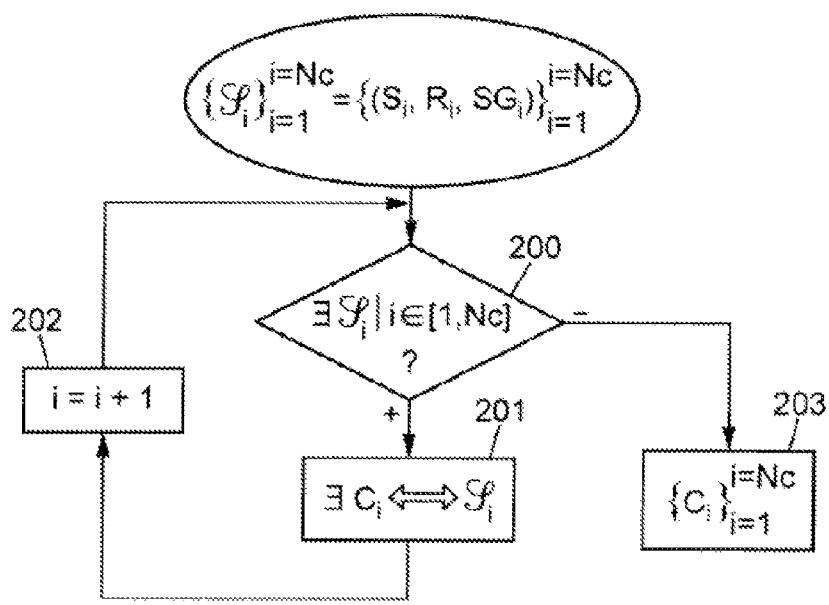
FIG. 2b shows, purely by way of illustration, a non-limitative example of implementation of a stage for identifying the electrical loads, from their signature.

Referring to FIG. 2b, the stage of acquisition of the aforementioned signatures is then followed, advantageously, by a stage for identifying the electrical loads constituting the whole subset of separate electrical loads in operation in at least one observation window. It is to be understood, in particular, that all or part of the set of electrical loads of the installation under consideration can be switched on simultaneously or not, depending on the individual switching on or switching off of each electrical load of the installation purely as desired by the user.

Thus, referring to FIG. 2b, starting from the set of stored signatures and of course of the triplets poles, residues singular value associated with each of the latter one proceeds to the identification, in a stage 200, of the existence in the installation of the poles, residues and singular value, existing and observed in operation. This identification process can be performed by comparing the values of the poles residues and singular value corresponding to the values of triplets associated with the corresponding signature, with a confidence interval for identifying these values.

This operation is represented in stage 200 by relation (7):

$$\exists \mathscr{S}_i \mid i \in [1, Nc]?$$

With a positive response in the aforementioned stage 200, discrimination of the signature $\mathscr{S}_i$ is associated with an electrical load $C_i$ corresponding to the specific electrical characteristics. It will be understood, in particular, that a bi-univocal correspondence can be effected between any value of signature or code of signatures $\mathscr{S}_i$ and the electrical characteristics of each electrical load, by the application of a library of loads associated with the library of signatures, as will be described later in the description.

Stages 200, 201 are continued by passing to the next signature by return to stage 200 via stage 202 symbolized by the relation i=i+1, for all the signatures of electrical loads that can be put in operation on the installation.

When the set of signatures, and therefore of electrical loads, that can be put in operation for the installation under consideration has been submitted to the test in stage 200, in stage 203 one has the set of electrical loads numbering Nc in operation on the installation, designated according to relation (8):

$$[C_i]_{i=1}^{i=Nc}$$

This set constitutes a subset of all of the electrical loads that can be put in operation for the installation under consideration, said subset being equal to all or part of this whole.

It is understood, of course, that the bi-univocal correspondence between the value or code of signature $\mathscr{S}$ and the corresponding electrical load $C_i$ is also established with the triplet $(S_i, R_i, SG_i)$ with which the latter is associated.

Detection of the presence or absence of each aforementioned triplet observed on the installation, and consequently of the signature $\mathscr{S}_i$ and of the corresponding electrical load $C_i$, makes it possible, according to a notable aspect of the method according to the invention, to execute a stage of monitoring of the switching on/off of each separate individual load by discrimination of all or part of the signature of the latter in at least one observation window.

It is understood in particular that the aforementioned discrimination can be performed on one or more values of the triplet associated with this load, according to a process of fuzzy logic as described previously in the description.

Figure 2C:
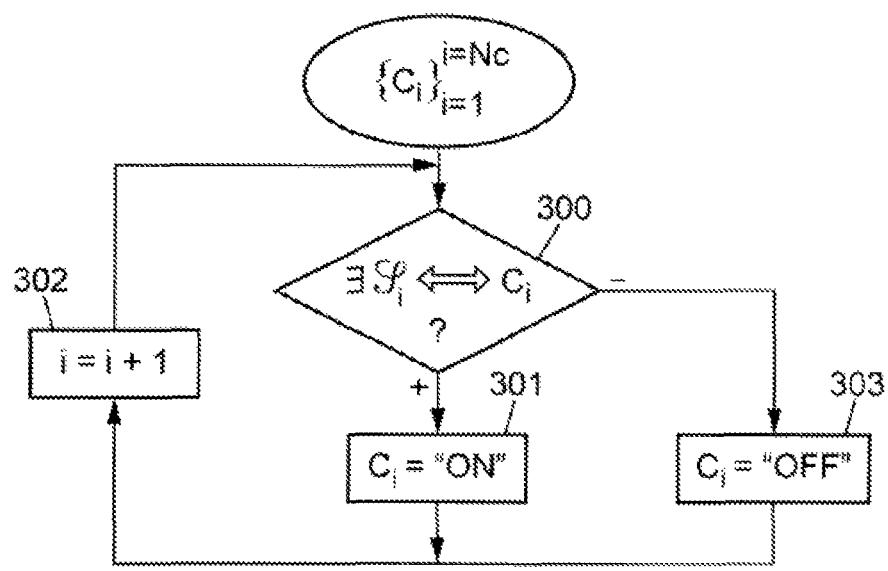
FIG. 2c shows, purely by way of illustration, a non-limitative example of application of execution of a stage of monitoring of putting into operation/out of operation respectively of each load based on discrimination of their signature.

As shown by way of example in FIG. 2c, for any electrical load $C_i$ of the aforementioned subset one proceeds in a testing stage 300 to identification of the signature $\mathscr{S}_i$, by discrimination of the values of poles, residues, singular value or of a combination of the latter according to relation (9):

$$\exists \mathscr{S}_i \Leftrightarrow C_i?$$

If the response to test 300 is positive, the electrical load $C_i$ is declared in operation "ON" in stage 301. Conversely, if the response to test 301 is negative, the electrical load $C_i$ is declared not in operation "OFF".

The monitoring process can be executed for any duration by returning to the test in stage 300 via stage 302, designated i=i+1.

Figure 3A:
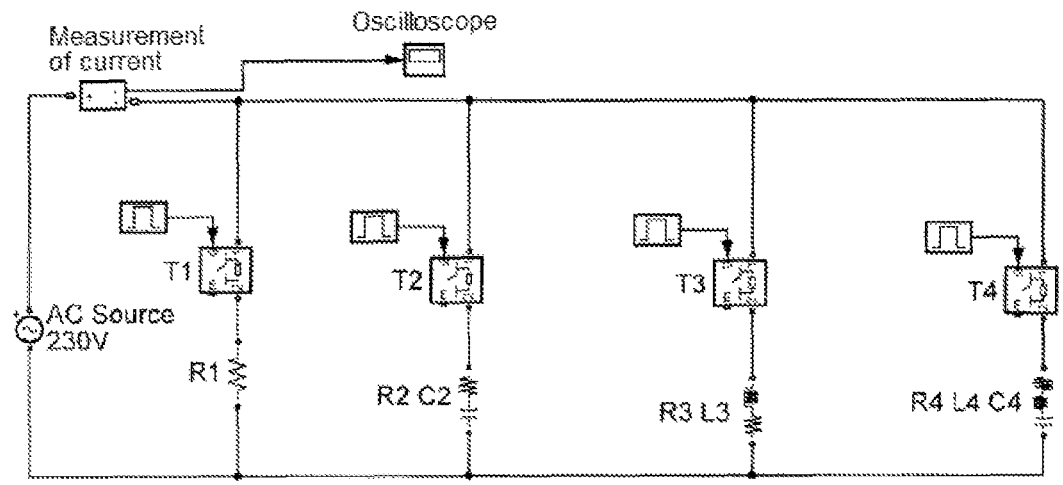
FIG. 3a shows, as an example purely by way of illustration, the electric circuit diagram of an arbitrary subscriber installation for representing the implementation of the method according to the invention on such an installation.

An example of implementation of the aforementioned processes, on an installation shown in FIG. 3a comprising a pure resistive load $R_1$, a resistive-capacitive load $R_2C_2$, a resistive-inductive load $R_3L_3$ and a resistive, capacitive and inductive load $R_4L_4C_4$ is described below.

The instantaneous current and instantaneous voltage are measured by sampling at the entry point of the electrical installation of a dwelling. These two analogue signals are converted to digital values by means of the ADC at the sampling frequency $$fe = \frac{1}{Te}.$$

The instantaneous power consumed by the loads that are present is calculated from these two measurements, using the relation given above. The switches $T_1$, $T_2$, $T_3$ and $T_4$ switch their respective load $R_1$, $R_2C_2$, $R_3L_3$ and $R_4C_4L_4$ according to the "ON", "OFF" logic depicted in FIG. 3b.

The Pencil method is applied in each observation window of the power, voltage and supply current.

N samples of the signal are taken for each observation window of index k.

The Pencil method makes it possible to filter the observed signal from the noise generated by the measurement and conversion chain, or even to eliminate a non-relevant component of the signal. For every given current observation window of rank k, it supplies the vectors of size M of the singular values $SG_{ik}$, of the poles $S_{ik}$, and of the residues $R_{ik}$ for the current, voltage and power.

Selective storage of the successive results supplied by the Pencil method makes it possible to perform temporal tracking.

The Pencil method is applied in each temporal observation window of the current. The duration $\Delta t$ of the window can be parameterized; in the given example it is selected as equal to $\Delta t = 10$ ms in the case of FIGS. 3c to 3g, i.e. a half-period for a supply frequency at 50 Hz.

Figure 3B:
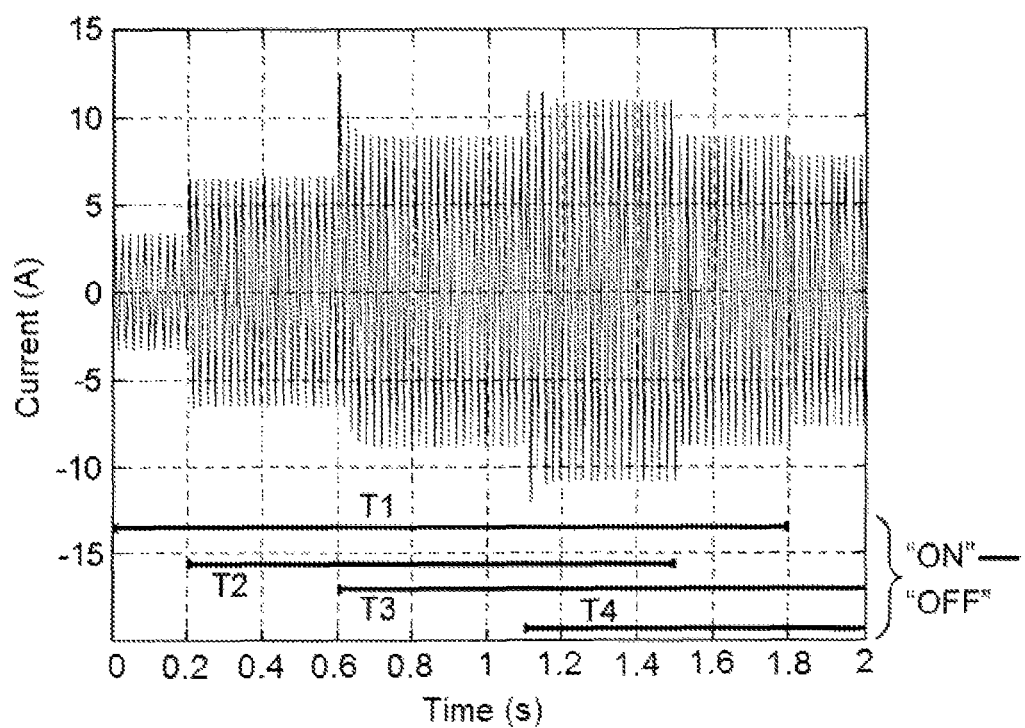
FIG. 3b shows, by way of example, the values of current intensity measured for switching of the loads of the installation in FIG. 3a, by the operation of switches T1, T2, T3 and T4 according to the time chart shown in FIG. 3b.
Figure 3C:
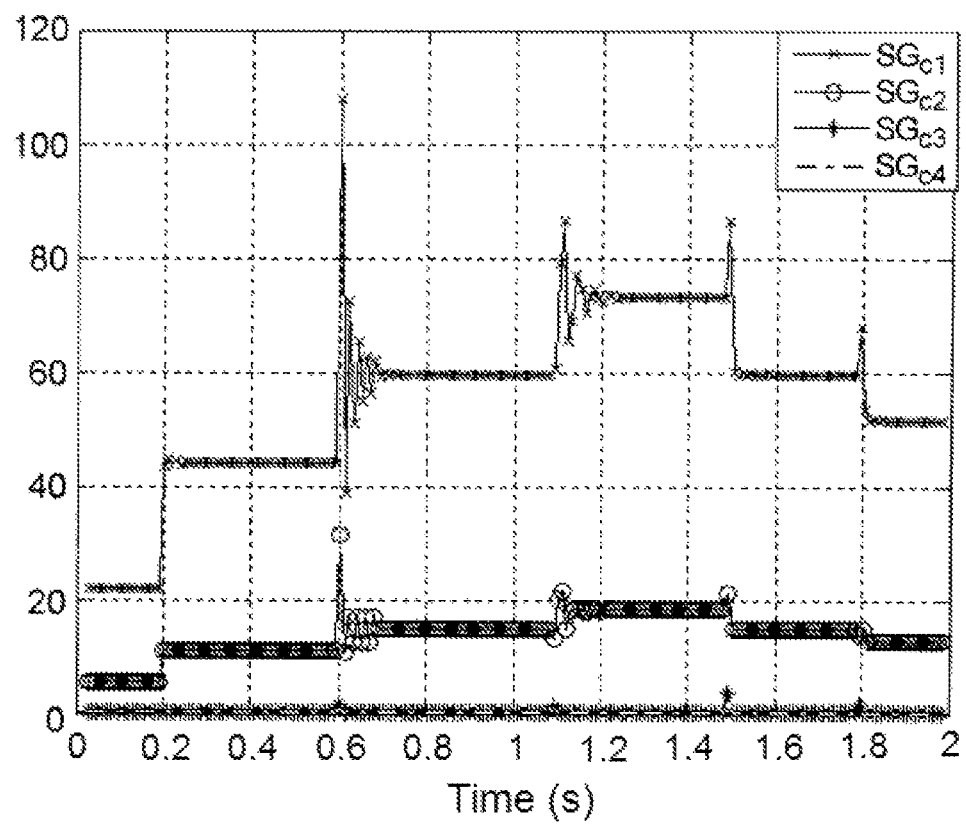
FIG. 3c shows the distribution and corresponding temporal tracking of the singular values found by the Pencil method, during switching of the loads of the installation shown in FIG. 3b.

An example of temporal tracking of the singular values is given in FIG. 3c.

In FIG. 3c, the abscissa is graduated in seconds and the ordinate in dimensionless relative value of singular value amplitude.

The envelope of the input current shown in FIG. 3b is at the level of variation of the singular values; their variations demonstrate the changes of states, in a roughly synchronous manner.

The number of poles and of residues that are relevant is found from suitable processing of these singular values. The temporal tracking of the real and imaginary parts of each pole is illustrated in FIGS. 3d and 3e respectively.

Figure 3D:
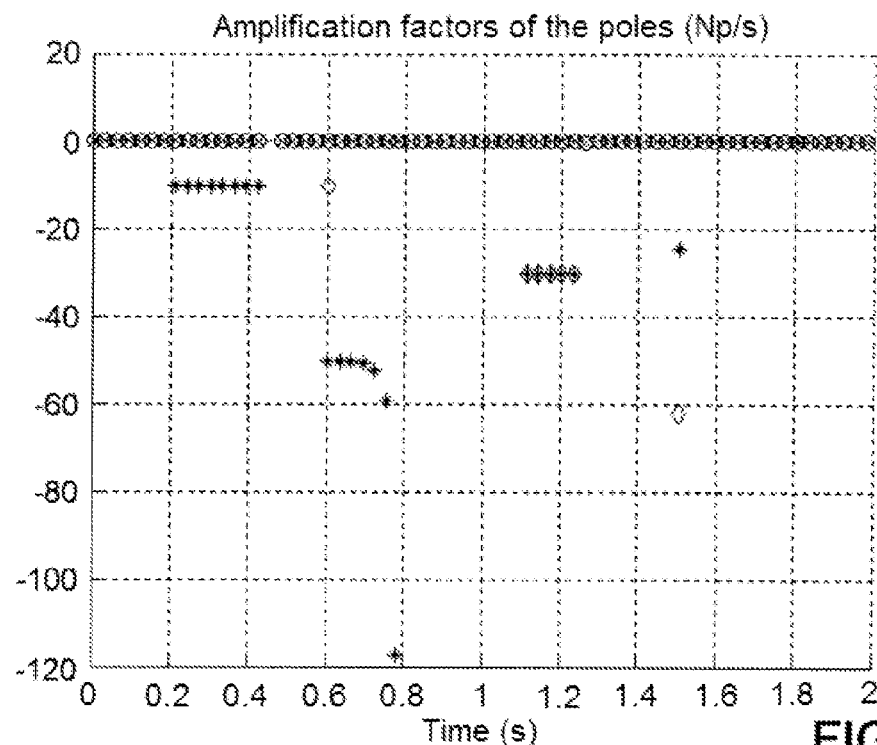
FIGS. 3d and 3e show a timing diagram of temporal tracking of the real values of the poles and respectively of the imaginary values of the poles, for switching of the loads of the installation shown in FIG. 3b.
Figure 3E:
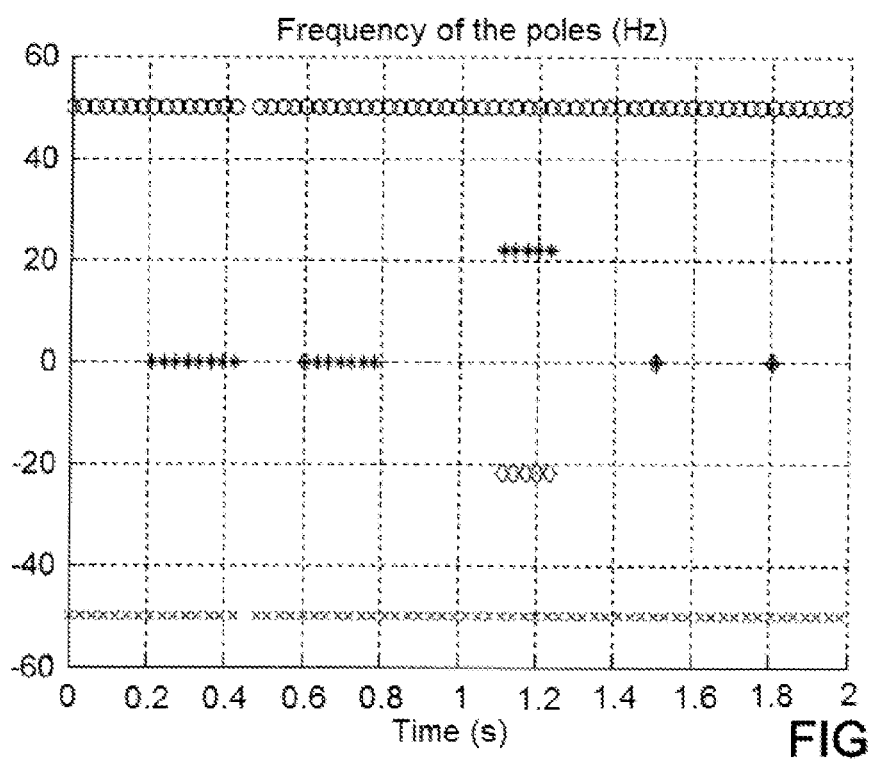

In FIG. 3d, the ordinate is graduated in nepers per second, Np/s, and, in FIG. 3e, the ordinate is graduated in hertz.

Figure 3F:
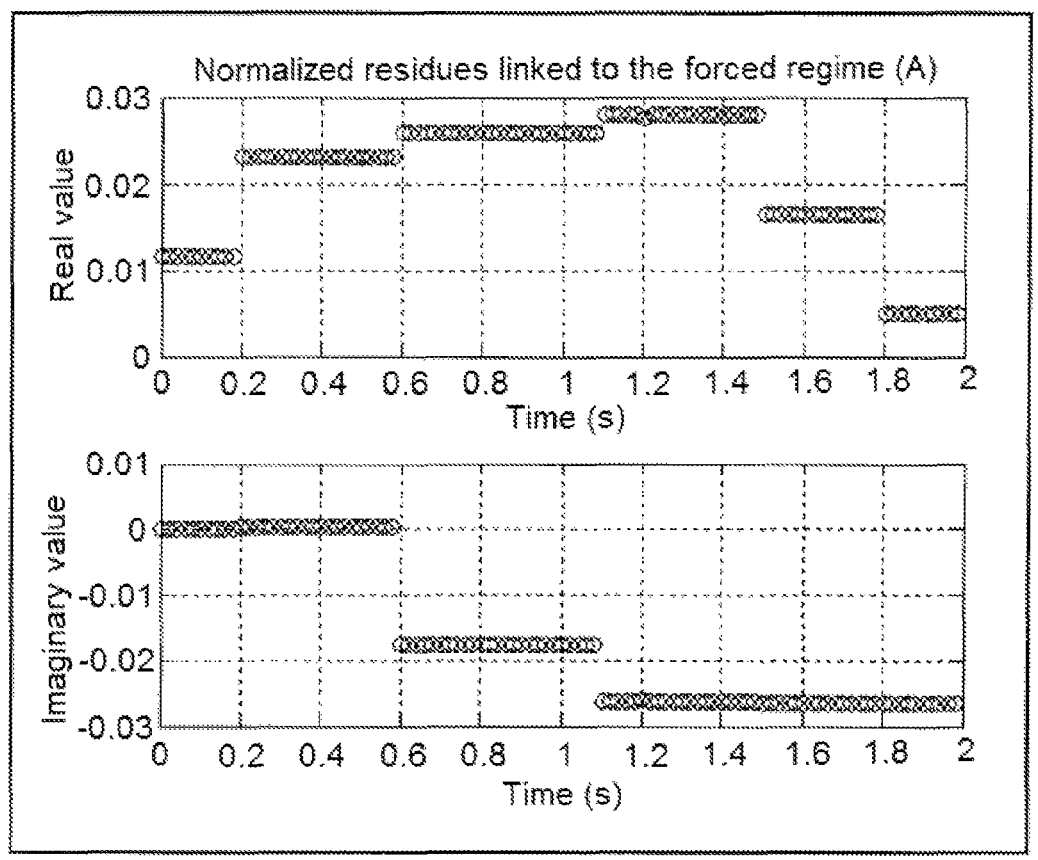
FIGS. 3f and 3g show a timing diagram of temporal tracking of the residues linked to the forced regime and respectively to the free regime for switching of the loads of the installation shown in FIG. 3b.
Figure 3G:
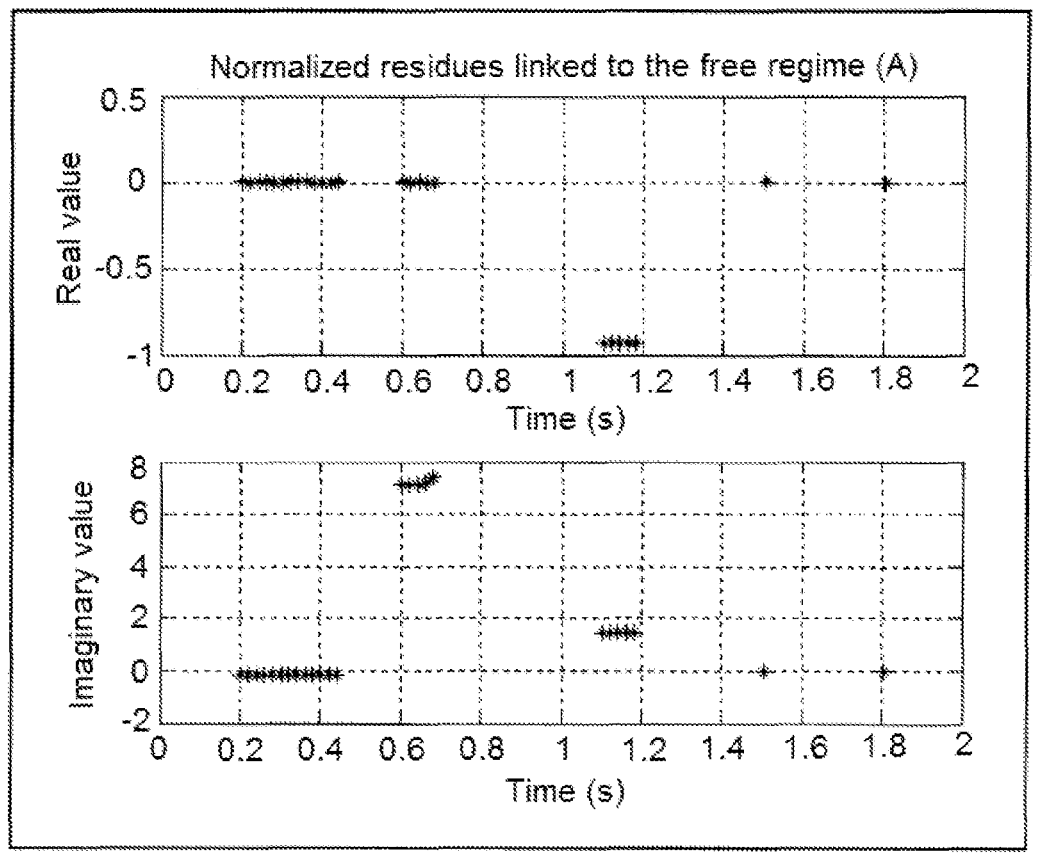

According to a non-limitative preferred embodiment, the temporal tracking of the residues is expressed by that of their normalized values, in forced regime and in free regime, FIGS. 3f and 3g. This choice, the most suitable, facilitates classification with respect to the residues. In FIGS. 3f and 3g, the ordinate is graduated in amperes (A).

These temporal trackings provide information on the characteristics of the loads.

The harmonics, including the fundamental harmonic, are characterized by purely imaginary poles, and they correspond to the forced regime of the loads.

The free regimes are characterized by poles whose real part gives information about the time constants (cf. FIG. 3d), and the imaginary part about the natural frequencies (cf. FIG. 3e).

The residues are directly related to the loads that are present and to the harmonics if said frequencies exist. According to a preferred embodiment, for the forced regime, a normalized value is defined for each residue $R_{ik}$. This definition can be given for any type of residue, voltage, current, power and, notably for the current residues, given by the following expression with, for the following example, $R_{ci}$ designated $\Re I_k^F$ denoting the current residue and $S_{ci}$ designated $SI_k^F$ the current pole in observation window number k, $\Re IN_k^F$ denoting the corresponding normalized value:

$$\Re IN_k^F = \Re I_k^F \cdot j\sqrt{2} \cdot e^{-SI_k^F \cdot t_{kd}}$$

with:

$t_{kd}$, the start time of observation window number k;

$\Re I_k^F$, the current residue linked to the forced regime and relating to window k, for the fundamental frequency and for the harmonic frequencies if they exist;

$SI_k^F$, the current pole linked to the forced regime and corresponding to the current residue $\Re I_k^F$.

FIG. 3f gives the time variation of the normalized current residues $\Re I_k^F$ linked to the positive frequencies. According to one embodiment, exploitation of the $\Re IN_k^F$ makes it possible to get back to the value of the load.

By analogy, normalization of the residues of the current linked to the free regime can be established in the following way, with $\Re IN_k^L$ denoting the corresponding normalized value:

$$\Re IN_k^L = \Re I_k^L \cdot j\sqrt{2} \cdot e^{-SI_k^L \cdot (t_{kd}-t_0)}$$

with $t_{kd}$, the start time of observation window number k;

$t_0$, time point of connection of the load;

$\Re I_k^L$, denotes the current residue linked to the free regime and relating to window k;

$SI_k^L$, denotes the current pole linked to the free regime, relating to window k and corresponding to residue $\Re I_k^L$.

FIG. 3g gives the time variation of $\Re IN_k^L$ the normalized residue of the current linked to the free regime. This figure shows three time points of load connection, i.e. $t_0$ corresponding to the time points 0.2 s, 0.61 s and 1.1 s.

The poles, FIGS. 3d, 3e, linked to positive excitation frequency, are represented by circles "○". Those linked to the conjugated negative frequency are represented by crosses "×". The poles linked to the free regime of the load are represented by stars and diamonds "*, ◇".

The normalized residues, linked to positive frequencies, are represented by circles "○" (FIG. 3f) in the case of the forced regime and by stars "*" (FIG. 3g) for the free regime.

It will be understood that the tracking process employed consists essentially of reading the values of poles, residues, and singular values and comparing these data for detecting a change of state.

The time points of change of state are detected from the level of variation of the singular values shown in FIG. 3c. These time points also appear in tracking of the normalized residues. This phenomenon is illustrated in FIG. 3f.

The interpretation of the temporal trackings of the poles and of the normalized residues-given by the four FIGS. 3d, 3e, 3f and 3g is as follows:

Between the Time Points 0 s and 0.2 s:

Between these two time points, FIGS. 3d and 3e give two pure imaginary poles (0+50j) and (0−50j) which correspond to the frequency of 50 Hz. It is understood that the general form of the normalized poles is given by 0±Fj, where F denotes the fundamental frequency of the supply voltage and $j=\sqrt{-1}$.

If we assume that no load is present before the time point t=0, the change of the residue linked to the forced regime, FIG. 3f, is $\Delta \Re N1_{calc}=(2.3069-4.2406 \cdot 10^{-6} j)-(0)$.

According to the preferred embodiment, from this information it is possible to deduce the modulus of the load as well as its phase. At this time point, a load of modulus 100Ω and of zero phase is present.

Now, the value used in the experiments was a resistance of value $R_1=100Ω$ and the theoretical value of the normalized residue is: $\Re N1_{Th}=2.3+0j$ Between Time Points 0.2 and 0.6 s:

Between these two time points, FIGS. 3d and 3e show the existence of three poles, (0+50j), (0−50j) and (−10+0j). The last-mentioned pole indicates the disconnection at time point 0.2 s of a first-order load with time constant $$\tau = \frac{1}{10} = 100 \text{ ms.}$$

According to the preferred embodiment, the change of the normalized residues linked to the forced regime at time point 0.2 s, supplied by FIG. 3f, is calculated:

$$\Delta \Re N2_{calc}=(4.6022+7.3130 \cdot 10^{-2}j)-(2.3069-4.2406 \cdot 10^{-6}j)=2.2953+7.3134 \cdot 10^{-2}j$$

According to the preferred embodiment and on the basis of this information, it is then possible to calculate the modulus of the load as well as its phase. At this time point, a load of modulus 100.15Ω and of phase −0.0318rd(−1.822°) is observed. The capacitive character of this load is deduced from this.

Now, the load that is switched on at the aforementioned time point is a series circuit RC of resistance $R_2=100Ω$ and of capacitance $C_2=1$ mF. The theoretical value of the corresponding normalized residue is $\Re N2_{Th}=2.2977+7.313 \cdot 10^{-2}j$, and is identical to that derived from the Pencil method.

Between Time Points 0.6 s and 1.1 s:

Between these two time points, FIGS. 3d and 3e give three poles, (0+50j) and (0−50j) as well as a new pole (−50+0j). The last-mentioned pole indicates the connection at time point 0.6 s of a first-order load with time constant $$\tau = \frac{1}{50} = 20 \text{ ms}.$$

According to the preferred embodiment, the change of the normalized residues linked to the forced regime at time point 0.6 s, supplied by FIG. 3e, is calculated:

$$\Delta \Re N3_{calc}=(5.168-3.4970j)-(4.6022+73130\cdot 10^{-2}j)$$
$$=0.56590-3.5701j$$

According to the preferred embodiment and on the basis of this information, it is possible to deduce the modulus of the load as well as its phase. At this time point, a load of modulus 63.62Ω and of phase 1.413rd(80.9589°) is present. The inductive character of this load is deduced from this.

Now, the load connected is a series circuit RL of resistance $R_3=10\Omega$ and of inductance $L_3=0.2H$. The theoretical value of the corresponding normalized residue is $\Re N3_{th}=0.56820-3.5701j$, and is identical to that derived from the Pencil method.

Between Time Points 1.1 s and 1.5 s:

Between these two time points, FIGS. 3d and 3e give four poles, (0+50j) and (0−50j) relating to the fundamental frequency as well as (−30+22j) and (−30−22j) relating to the natural frequency of the load. Based on these poles, one can recognize the presence of a second-order load at time point 1.1 s (appearance of two conjugated complex poles).

At this time point, according to the preferred embodiment, the change of the normalized residues linked to the forced regime is calculated:

$$\Delta \Re N4_{calc}=(5.5818-5.2337j)-(5.168-3.4970j)$$
$$=0.41370-1.7367j$$

According to the preferred embodiment and based on this information, the modulus of the load as well as its phase can be calculated. At this time point one has a load of modulus 128.83Ω and of phase 1.3369rd (76.5987°). The inductive character of this load is deduced from this. Now, the load connected is a series circuit RLC of resistance $R_4=30\Omega$, of inductance $L_4=0.5H$ and of capacitance $C_4=0.1$ mF. The corresponding theoretical normalized residue is $\Re N4_{th}=0.41598-1.7367j$, and is identical to that derived from the Pencil method.

Between Time Points 1.5 s and 1.8 s:

The negative change of the singular values at time point 1.5 s indicates, on the one hand, the disconnection of one of the four loads that were switched on between time points 0 s and 1.5 s. On the other hand, the change of the normalized residues of the forced regime is $\Delta \Re N5_{calc}=-2.2953-7.31\cdot 10^{-2}j$. According to the preferred embodiment, one deduces from this the disconnection of load No. 2, which was switched on at time point 0.2 s.

Between Time Points 1.8 s and 2 s:

The negative change of the singular values at time point 1.8 s indicates on the one hand the disconnection of one of the four loads that were switched on between time points 0 s and 1.8 s. On the other hand, the change of the normalized residues of the forced regime is $\Delta \Re N6_{calc}=2.2977+0j$. According to the preferred embodiment, one deduces from this the disconnection of load No. 1 which was switched on at time point 0 s.

Thus, according to a notable aspect of the method according to the invention, it is understood that discrimination of the set of poles $S_i$, residues $R_i$ and singular values $SG_i$ is performed by reading the corresponding values found by application of the Pencil method.

Moreover, in the preferred embodiment of the method according to the invention, in which the poles and the residues are established according to their normalized definition, the switching on and off of each individual electrical load $C_i$ can be monitored, particularly advantageously, by simple calculation of the algebraic change of the normalized residues. In particular the appearance, switching on, of a load is detected by the appearance of the algebraic value of the residue $R_i$ associated with this load, and the disappearance, disconnection, of this load is detected by the appearance of the opposite algebraic value of the residue $R_i$ associated with this load.

A summary of the characteristics of the residues, poles and singular values, defining the signatures obtained in relation to the electrical characteristics of electrical loads connected respectively disconnected in an installation will now be given below.

Consider an observation window, or a succession of observation windows, of the consumption signal including the free regime and the beginning of the forced regime of connection/disconnection of an electrical load.

Characteristically:
the connection/disconnection of a purely resistive load is signified by a unique forced regime, by the existence, for the observation window considered, of two conjugated complex poles with a zero real part and of two conjugated complex residues in the forced regime.

Moreover, the residues have a zero phase in the forced regime.

The table designated Resistive load table gives the values of the poles and corresponding normalized residues.

Resistive Load Table:

|  | Forced regime | |
|---|---|---|
| Poles | $(0 + 50 \cdot j)$ | $(0 - 50 \cdot j)$ |
| Residues | $(x + y \cdot j)$ | $(x - y \cdot j)$ |

The existence of two values for the poles and the residues, as well as the zero phase of the normalized residues linked to the forced regime, make it possible to deduce the resistive nature of the load under analysis;

the connection/disconnection of a resistive and capacitive load is signified by a separate free regime and forced regime, the existence for the observation window of two conjugated complex poles with a zero real part and of two conjugated complex residues in the forced regime and by a real pole and a complex residue in the free regime. The negative phase of the residue in the forced regime characterizes the overall capacitive nature of the load.

Table of Load RC:

|  | Forced regime | | Free regime |
|---|---|---|---|
| Poles | $(0 + 50 \cdot j)$ | $(0 - 50 \cdot j)$ | $(\alpha + 0 \cdot j)$ |
| Residues | $(x + y \cdot j)$ | $(x - y \cdot j)$ | $(a + b \cdot j)$ |

The phase of the normalized residues linked to the permanent regime is negative. By comparing the absolute value of the phase with the product $\alpha \cdot \omega$ or the reciprocal of this product, it is possible to deduce the existence of a load RC in series or of a load RC in parallel.

the connection/disconnection of a resistive and inductive load is signified by a separate free regime and forced regime, by the existence for the observation window of two conjugated complex poles with a zero real part and of two conjugated complex residues in the forced regime and by a real pole and a complex residue in the free regime. The positive phase of the residue characterizes the overall inductive nature of the load.

Table of Load RL:

|  | Forced regime |  | Free regime |
| --- | --- | --- | --- |
| Poles | $(0 + 50 \cdot j)$ | $(0 - 50 \cdot j)$ | $(\alpha + 0 \cdot j)$ |
| Residues | $(x + y \cdot j)$ | $(x - y \cdot j)$ | $(a + b \cdot j)$ |

The phase of the normalized residues linked to the free regime is positive.

By comparing the absolute value of the phase with the product $\alpha \cdot \omega$ or the reciprocal of the latter, it is possible to deduce the existence of a load RL in series or of a load RL in parallel.

the connection/disconnection of a resistive, inductive and capacitive load is signified by a separate forced regime and free regime and by the existence, in the forced regime, of two conjugated complex poles with a zero real part and of two conjugated complex residues and, in the free regime, of two conjugated complex poles and two conjugated complex residues. The negative phase of the residue in the forced regime characterizes the overall capacitive nature of the load and the positive phase of the residue in the forced regime characterizes the overall inductive nature of the load.

Table of Load RLC:

|  | Forced regime |  | Free regime |  |
| --- | --- | --- | --- | --- |
| Poles | $(0 + 50 \cdot j)$ | $(0 - 50 \cdot j)$ | $(\alpha + \beta \cdot j)$ | $(\alpha - \beta \cdot j)$ |
| Residues | $(x + y \cdot j)$ | $(x - y \cdot j)$ | $(a + b \cdot j)$ | $(a - b \cdot j)$ |

It will be recalled that the set of values of poles and of residues given in the preceding tables is obtained by application of the Pencil method. In particular, in the example of the values given, the numerical values 50 assigned to the imaginary part of the poles corresponds in fact to the value of the fundamental frequency of the supply voltage of the installation. This value is replaced by the value 60 for application of the method according to the invention in countries where the power supply grids are a.c. grids at frequency 60 Hz.

A more detailed description of a device for non-intrusive determination of the electrical power consumed by a subscriber installation, according to the present invention, will now be given, referring to FIG. 4a and FIG. 4b.

Figure 4A:
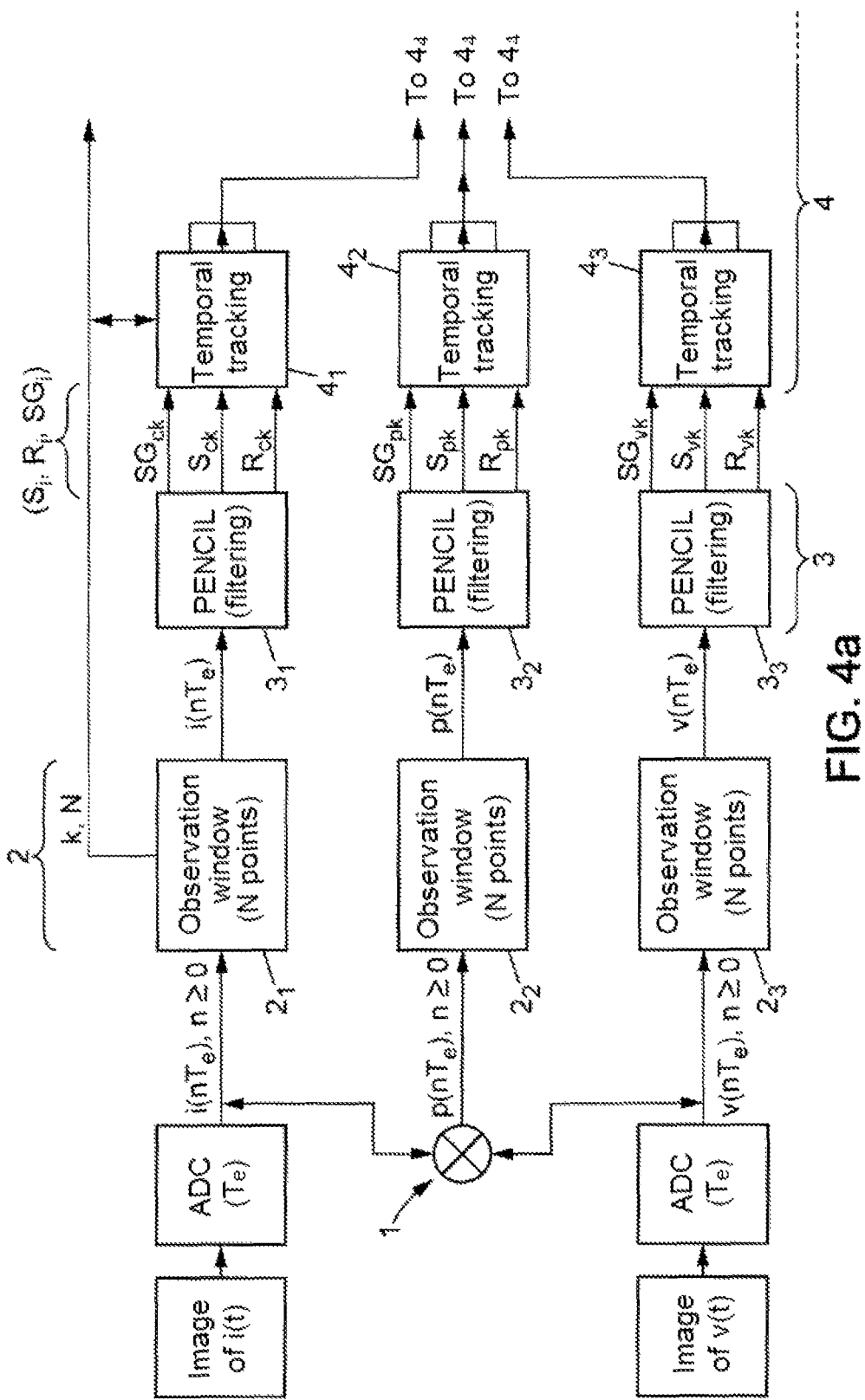

As shown in the aforementioned FIG. 4a, the device according to the invention comprises means for periodic sampling of the values of supply voltage and of electric current intensity delivered to the installation under consideration, for the purpose of obtaining a consumption signal.

In the aforementioned figure, the corresponding means are assumed to be constituted by a circuit delivering an image of the supply voltage and a circuit delivering an image of the electric current intensity delivered to the installation. These circuits can advantageously be constituted by any voltage-sampling or current-sampling circuit accompanied by suitable samplers delivering, under Shannon sampling conditions, an image of the voltage or of the current intensity delivered. These circuits can be followed by analogue and digital converters at the sampling frequency or period designated $T_e$. This type of circuit will not be described in detail as it corresponds to circuits known by a person skilled in the art in the corresponding technical field.

Each analogue-to-digital converter circuit ADC delivers, with a rhythm corresponding to the sampling period $T_e$, the voltage samples designated $v(nT_e)$ or current samples $i(nT_e)$, of course for $n \geq 0$, n denoting the rank of the sample.

According to a particularly advantageous characteristic, the device according to the invention comprises a calculating means 1 of the instantaneous power delivered, the product of the sampled values of the values of supply voltage and of electric current intensity delivered. Thus, in FIG. 4a, the calculating means 1 receives the sampled values of currents $i(nT_e)$, and of voltage $v(nT_e)$ and delivers a value that is the product of these values received, constituting the value of instantaneous power delivered, designated $p(nT_e)$.

According to another characteristic of the method and of the device according to the invention, the consumption signal is constituted by at least one of the samples of intensity delivered $i(nT_e)$, of voltage delivered $v(nT_e)$ and of instantaneous power delivered $p(nT_e)$ to the installation. The aforementioned components of the consumption signal are examined for determining the poles, the residues and the singular values owing to the device according to the invention, in the following way. The device according to the invention, shown in FIG. 4a, comprises for this purpose, means for storing and reading the successive values of the consumption signal in at least one observation window, the operations for storing and reading being performed of course in several successive observation windows.

It comprises for example, as shown in FIG. 4a, means for creating observation windows for the aforementioned components of intensity, voltage and power. These means are designated $2_1, 2_2, 2_3$ in this figure. They can consist conventionally of circuits for write/read addressing in memory of the aforementioned stored components for a plurality of successive values of rank n comprised between $(k-1)N$ and $kN-1$, N denoting the number of samples in the window of rank k being considered, in connection with FIG. 1a.

The device according to the invention shown in FIG. 4a further comprises means 3 for application, on the consumption signal and on at least one current observation window, as defined previously, of a filtering treatment by the Pencil method, for the purpose of discriminating in the window of the consumption signal, the set of poles and residues that are representative, with the singular values, of a combination of signatures of separate electrical loads in operation in the installation under consideration.

Examining FIG. 4a, it will be seen that the means 3 for application of the filtering treatment by the Pencil method advantageously comprise separate modules bearing the reference $3_1, 3_2, 3_3$, each receiving the aforementioned components of intensity, of power or of voltage of the consumption signal.

Each separate module $3_1, 3_2, 3_3$ can be constituted by a dedicated computer incorporating suitable software.

Each of the aforementioned modules delivers the poles, residues and singular values for the component of intensity, of instantaneous power, and of voltage of the consumption signal, these values being designated respectively $S_{ck}, R_{ck}, SG_{ck}$ for the component of intensity, $S_{Pk}, R_{Pk}, SG_{Pk}$ for the component of instantaneous power, and $S_{vk}, R_{vk}, SG_{vk}$ for the component of voltage delivered to the installation. The aforementioned values are, of course, none other than the values of poles $S_i$, of residues $R_i$ and of singular values $SG_i$ previously mentioned in the description.

Moreover, as shown in FIGS. 4a and 4b, the device according to the invention comprises means 4 for temporal tracking of the combination of signatures and therefore of the electrical loads and for calculation, for at least the duration of the current observation window of rank k, of at least the active power consumed by at least one subset of the electrical loads in operation in the installation. The aforementioned calculated power is expressed as the sum of the powers, such as the active power, consumed by each separate electrical load of the aforementioned subset verifying a function of consumed power linking the poles and the residues.

It is understood of course that the power function linking the poles and the residues, notably for the active power, complies with relation (4) previously mentioned in the description.

It can also be seen from FIG. 4a that the means 4 for temporal tracking of the combination of signatures also comprise separate modules referenced $4_1, 4_2, 4_3$ operating on the poles, residues, and singular values of the component of intensity, of power or of voltage delivered to the installation.

In particular, temporal tracking of the combination of signatures is performed according to the process described in connection with FIGS. 2a to 2c, in particular by detection of the algebraic change of the values of the residues and of the corresponding poles for example.

Moreover, the means 4 for temporal tracking are now described below in detail, referring to FIG. 4b.

Referring to the aforementioned FIG. 4b, the means 4 for temporal tracking further comprise at least one module $4_4$ for detecting change of state of connection/disconnection of the electrical load, which receives the numerical values representative of the combination of signatures delivered by each separate module $4_1, 4_2$ and $4_3$, directly connected to a module $4_5$ for identifying the connected and/or disconnected electrical loads from the aforementioned signatures of electrical loads.

Module $4_5$ for identifying the connected and/or disconnected electrical loads is itself connected to a library module $4_6$ of electrical loads identified in relation to their signatures and to a module $4_7$ for identifying the consumption usages of the subscriber use and for calculating the consumption at least of active power.

As shown in the aforementioned FIGS. 4a and 4b, modules $4_1$ to $4_7$ are of course synchronized by a signal designated k, N on reading each observation window of rank k having, for a number N of samples, a given number of values of residues, poles, singular values delivered by each respective module $3_1, 3_2, 3_3$ relating to the components of intensity, of instantaneous power or of voltage, as described previously in the description.

Each of the aforementioned modules operates, for performing tracking, by reading the values of poles, of residues and of the corresponding singular value, as described previously in the description, with reference to FIGS. 2c and 3b to 3g.

It is understood, in particular, that the filtering modules $3_1, 3_2$ and $3_3$ can be constituted by a computer program that can be executed by a computer or by the central processing unit of a dedicated device in fact permitting application of the Pencil method to the samples of the components of current intensity, instantaneous power and supply voltage delivered to the installation for obtaining the singular values, poles and residues relating to the aforementioned components of the consumption signal.

It is also understood that the temporal tracking modules $4_1, 4_2, 4_3$ can also be constituted by a computer program that can be executed by a computer or by the central processing unit of a dedicated device in fact permitting application of the process of temporal tracking of the connection/disconnection of electrical loads as shown in FIGS. 2c, 3b to 3g, as described previously in the description.

With regard to the library module $4_6$, the latter can be said to permit the establishment of bi-univocal correspondence between the signature or signature code value $\mathcal{S}_i$ the value of the poles, residues and corresponding singular value and moreover of all electrical characteristics and/or electromechanical characteristics of electrical loads normally available commercially and making it possible to deduce tracking of consumption by a specific electrical load. This computer program comprises at least one routine for calculating the active power consumed by each separate electrical load complying with a consumed power function linking the poles and the residues of the consumption signal, complying with relation (4) described previously.

In a non-limitative example of implementation, the code value allocated to the signature $\mathcal{S}_i$ of an electrical load $C_i$ is a unique value obtained by parameterization of a signature process, such as the RSA (Rivest Shamir Adleman) process or algorithm, for example, from the values of residues, poles and the corresponding singular value.

The method and device according to the invention are particularly suitable for implementation of processes for detecting and tracking usages of electricity consumption by subscribers. Module $4_7$ for identifying consumption usages can employ techniques for the detection and tracking of consumption habits based on statistical techniques known by a person skilled in the art.

The invention claimed is:

1. A method for non-intrusive determination of electrical power consumed by a subscriber installation, in which periodic sampling of values of supply voltage and of electric current intensity delivered to said subscriber installation is performed in order to obtain a consumption signal, wherein the periodic sampling comprises the steps of, based on the sampled values of the consumption signal:

grouping by a processor said values sampled in successive observation time windows;

discriminating by a processor in each successive current observation time window a set of poles and of residues of the consumption signal by a Pencil method, said set of poles and residues being representative, in a current observation window, of a combination of signatures of separate electrical loads including at least defined poles and residues associated with at least one singular value obtained by the Pencil method in operation in said subscriber installation;

calculating by a processor, for at least a duration of said current observation window, at least a subset active power consumed by at least one subset of the electrical loads in operation in the subscriber installation, expressed as a sum of separate active powers consumed by each separate electrical load of said subset complying with a consumed power function;

wherein, for said subset active power, said consumed power function complies with a relation:

$$P = \sum_{i=1}^{M}\sum_{i'=1}^{M'} R_{ci} \cdot R_{vi'} \cdot e^{(S_{ci}+S_{vi'})(t_{kd}+\frac{\Delta t}{2})} \cdot \sinh c\left((S_{ci} + S_{vi'})\frac{\Delta t}{2}\right)$$

where P: denotes the subset active power consumed by the subset of separate electrical loads $C_i$ of signature $(S_i, R_i, SG_i)$;
$S_{ci}$ and $R_{ci}$: denote the poles and respectively the residues of the sampled current delivered to the subscriber installation;
$S_{vi'}$ and $R_{vi'}$: denote the poles and respectively the residues of the sampled voltage delivered to the subscriber installation, SGi denoting the singular values;
$t_{kd}$: denotes the start time of the observation window of rank k;
$\Delta t$: denotes the duration of the observation window;
sinh c(X): a hyperbolic sine function of a cardinal of a value X, wherein:

$$\sinh c\left((S_{ci} + S_{vi'})\frac{\Delta t}{2}\right) = \sinh\left((S_{ci} + S_{vi'})\frac{\Delta t}{2}\right) / \left((S_{ci} + S_{vi'})\frac{\Delta t}{2}\right);$$

M: denotes the number of poles and residues of the sampled current delivered to the subscriber installation;
M': denotes the number of poles and residues of the sampled voltage delivered to the subscriber installation.

2. The method according to claim 1 wherein for a roughly periodic supply voltage of angular frequency and of period T, the duration of each current observation window is taken as equal to said period.

3. The method according to claim 1, wherein a sampling frequency for obtaining said consumption signal and said duration $\Delta t$ of each observation window are linked by a relation:

$$\Delta t \cdot fe = Nem \geq 2 \cdot \left[\sum_{i=1}^{Nc} nci + 2(1+H)\right]$$

in which:
fe: denotes the sampling frequency;
Nem: denotes a minimum number of samples for the duration of each observation window;
Nc: denotes an observed number of separate electrical loads ($C_i$) of the subscriber installation;
nci: denotes the number of poles of the electrical load ($C_i$);
H: denotes the number of harmonic components of the fundamental frequency of the supply voltage.

4. The method according to claim 1, wherein, following the stage consisting of discriminating the set of poles and of residues of the consumption signal, the method further comprises a stage of discrimination and of acquisition of the signatures formed by a pair of poles residues of each separate electrical load and of the singular values.

5. The method according to claim 4, wherein, following acquisition of said signatures said method comprises a stage for identifying said electrical loads constituting said subset of separate electrical loads in operation in at least one observation window.

6. The method according to claim 5, wherein, for an observation window of the consumption signal including a free regime and a beginning of a forced regime of connection/disconnection of a load,
the connection/disconnection of a purely resistive load is signified by a unique forced regime, by the existence, for the observation window, of two conjugated complex poles with a zero real part and of two conjugated complex residues in the forced regime, and by zero phase of the residues in the forced regime;
the connection/disconnection of a resistive and capacitive load is signified by a separate free regime and a separate forced regime, the existence, for the observation window, of two conjugated complex poles with a zero real part and of two conjugated complex residues in the forced regime and by a real pole and a residue in the free regime, a negative phase of the residue in forced regime characterizing the overall capacitive nature of the load;
the connection/disconnection of a resistive and inductive load is signified by a separate free regime and a separate forced regime, by the existence, for the observation window, of two conjugated complex poles with a zero real part and of two conjugated complex residues in the forced regime and by a real pole and a complex residue, in the free regime, a positive phase of the residue characterizing the overall inductive nature of the load.

7. The method according to claim 5, wherein for an observation window of the consumption signal including a free regime and a start of a forced regime of connection/disconnection of a load, the connection/disconnection of a resistive, inductive and capacitive load is signified by a separate forced regime and a separate free regime, by the existence:
in forced regime, of two conjugated complex poles with a zero real part and two conjugated complex residues; and,
in free regime, of two conjugated complex poles and two conjugated complex residues, a negative phase of the residue in the forced regime characterizing an overall capacitive nature of the load and a positive phase of the residue in the forced regime characterizing an overall inductive nature of the load.

8. The method according to claim 4 wherein, following acquisition of said signatures, said method comprises a stage of tracking of switching on/off of each separate load, by discrimination of all or part of the signature in at least one observation window.

9. The method according to claim 8, wherein, for an observation window of the consumption signal including a free regime and a beginning of a forced regime of connection/disconnection of a load,
the connection/disconnection of a purely resistive load is signified by a unique forced regime, by the existence, for the observation window, of two conjugated complex poles with a zero real part and of two conjugated complex residues in the forced regime, and by zero phase of the residues in the forced regime;
the connection/disconnection of a resistive and capacitive load is signified by a separate free regime and a separate forced regime, the existence, for the observation window, of two conjugated complex poles with a zero real part and of two conjugated complex residues in the forced regime and by a real pole and a residue in the free regime, a negative phase of the residue in forced regime characterizing the overall capacitive nature of the load;
the connection/disconnection of a resistive and inductive load is signified by a separate free regime and a separate forced regime, by the existence, for the observation window, of two conjugated complex poles with a zero real part and of two conjugated complex residues in the forced regime and by a real pole and a complex residue, in the free regime, a positive phase of the residue characterizing the overall inductive nature of the load.

10. The method according to claim 8, wherein for an observation window of the consumption signal including a free regime and a start of a forced regime of connection/disconnection of a load, the connection/disconnection of a resistive, inductive and capacitive load is signified by a separate forced regime and a separate free regime, by the existence:
- in forced regime, of two conjugated complex poles with a zero real part and two conjugated complex residues; and,
- in free regime, of two conjugated complex poles and two conjugated complex residues, a negative phase of the residue in the forced regime characterizing an overall capacitive nature of the load and a positive phase of the residue in the forced regime characterizing an overall inductive nature of the load.

11. A device for non-intrusive determination of electrical power consumed by a subscriber installation, having at least means for periodic sampling of values of supply voltage and of electric current intensity delivered to said subscriber installation for obtaining a consumption signal, wherein said device further comprises at least:
- means for calculating instantaneous power delivered, a product of the sampled values of the values of supply voltage and of the electric current intensity delivered, said consumption signal having at least one of the sampled values of the supply voltage delivered, the electric current intensity delivered or the instantaneous power delivered;
- means for storing and reading successive values of the consumption signal in at least one observation window;
- means for application, on the consumption signal, in at least one current observation window, of a filtering treatment by a Pencil method, for discriminating, in said window, a set of poles and residues representative of a combination of signatures of separate electrical loads including at least the poles and the residues associated with at least one singular value obtained by the Pencil method in operation in the subscriber installation;
- means for temporal tracking of said combination of signatures and for calculating, for at least a duration of the current observation window, at least a subset active power consumed by at least one subset of the electrical loads in operation in the subscriber installation, expressed as a sum of separate active powers consumed by each separate electrical load of this subset complying with a consumed power function linking said poles and residues;

wherein, for said subset active power, said function complies with:

$$P = \sum_{i=1}^{M} \sum_{i'=1}^{M'} R_{ci} \cdot R_{vi'} \cdot e^{(S_{ci}+S_{vi'})(t_{kd}+\frac{\Delta t}{2})} \cdot \sinh c\left((S_{ci}+S_{vi'})\frac{\Delta t}{2}\right)$$

where P: denotes the subset active power consumed by the subset of separate electrical loads $C_i$ of signature $(S_i, R_i, SG_i)$;
$S_{ci}$ and $R_{ci}$: denote the poles and respectively the residues of the sampled current delivered to the installation;
$S_{vi'}$ and $R_{vi'}$: denote the poles and respectively the residues of the sampled voltage delivered to the installation, SGi denoting the singular values;
$t_{kd}$: denotes the start time of the observation window of rank k;
$\Delta t$: denotes the duration of the observation window;
sinh c(X): the hyperbolic sine function of the cardinal of the value X, i.e.

$$\sinh c\left((S_{ci}+S_{vi'})\frac{\Delta t}{2}\right) = \sinh\left((S_{ci}+S_{vi'})\frac{\Delta t}{2}\right) / \left((S_{ci}+S_{vi'})\frac{\Delta t}{2}\right);$$

M: denotes the number of poles and residues of the sampled current delivered to the installation;
M': denotes the number of poles and residues of the sampled voltage delivered to the installation.

12. The device according to claim 11, wherein said means for temporal tracking of said combination of signatures and for calculating at least the subset active power consumed by at least one subset of the electrical loads comprise:
- separate modules operating on the poles, residues, singular values of a component of intensity, of power or of voltage delivered to the installation;
- a module for detecting change of state of connection/disconnection of electrical load;
- a module for identifying connected and/or disconnected electrical loads from the signatures of electrical loads;
- a library module of electrical loads identified in relation to their signature;
- a module for identifying consumption usages of the subscriber use and for calculating the consumption, at least of active power.

13. A non-transitory computer readable storage medium containing computer instructions stored therein for causing a computer processor or the central processing unit of a dedicated device to apply a method for non-intrusive determination of electrical power consumed by a subscriber installation, in which periodic sampling of values of supply voltage and of electric current intensity delivered to said subscriber installation is performed in order to obtain a consumption signal, by performing the steps of, based on the sampled values of the consumption signal:
- grouping said values sampled in successive observation time windows;
- discriminating in each successive current observation time window a set of poles and of residues of the consumption signal by a Pencil method, said set of poles and residues being representative, in a current observation window, of a combination of signatures of separate electrical loads including at least defined poles and residues associated with at least one singular value obtained by the Pencil method in operation in said subscriber installation;
- calculating, for at least a duration of said current observation window, at least a subset active power consumed by at least one subset of the electrical loads in operation in the subscriber installation, expressed as a sum of separate active powers consumed by each separate electrical load of said subset complying with a consumed power function linking said poles and residues;

wherein, for said active power, said function complies with a relation:

$$P = \sum_{i=1}^{M} \sum_{i'=1}^{M'} R_{ci} \cdot R_{vi'} \cdot e^{(S_{ci}+S_{vi'})(t_{kd}+\frac{\Delta t}{2})} \cdot \sinh c\left((S_{ci}+S_{vi'})\frac{\Delta t}{2}\right)$$

where P: denotes the subset active power consumed by the subset of separate electrical loads $C_i$ of signature $(S_i, R_i, SG_i)$;
$S_{ci}$ and $R_{ci}$: denote the poles and respectively the residues of the sampled current delivered to the installation;
$S_{vc}$ and $R_{vi}$: denote the poles and respectively the residues of the sampled voltage delivered to the installation, SGi denoting the singular values;

$t_{kd}$: denotes the start time of the observation window of rank k;

$\Delta t$: denotes the duration of the observation window;

sinh c(X): the hyperbolic sine function of the cardinal of the value X, i.e.

$$\sinh c\left((S_{ci}+S_{vi'})\frac{\Delta t}{2}\right) = \sinh\left((S_{ci}+S_{vi'})\frac{\Delta t}{2}\right) \bigg/ \left((S_{ci}+S_{vi'})\frac{\Delta t}{2}\right);$$

M: denotes the number of poles and residues of the sampled current delivered to the installation; and M': denotes the number of poles and residues of the sampled voltage delivered to the installation.

14. The non-transitory computer readable storage medium according to claim 13, wherein said computer instructions comprise at least one routine for calculating the separate active power consumed by each separate electrical load complying with a consumed power function linking the poles and residues of the consumption signal.

* * * * *